(12) United States Patent
Zhang et al.

(10) Patent No.: US 9,362,445 B2
(45) Date of Patent: Jun. 7, 2016

(54) LIGHT-EMITTING DEVICE

(71) Applicant: Nanyang Technological University, Singapore (SG)

(72) Inventors: Zi-Hui Zhang, Singapore (SG); Swee Tiam Tan, Singapore (SG); Xiaowei Sun, Singapore (SG); Hilmi Volkan Demir, Singapore (SG)

(73) Assignee: Nanyang Technological University, Singapore (SG)

( * ) Notice: Subject to any disclaimer, the term of this patent is extended or adjusted under 35 U.S.C. 154(b) by 0 days.

(21) Appl. No.: 14/409,340

(22) PCT Filed: May 30, 2013

(86) PCT No.: PCT/SG2013/000224
§ 371 (c)(1),
(2) Date: Dec. 18, 2014

(87) PCT Pub. No.: WO2013/191649
PCT Pub. Date: Dec. 27, 2013

(65) Prior Publication Data
US 2015/0179872 A1    Jun. 25, 2015

Related U.S. Application Data

(60) Provisional application No. 61/662,174, filed on Jun. 20, 2012.

(51) Int. Cl.
| | | |
|---|---|---|
| *H01L 27/15* | (2006.01) |
| *H01L 33/00* | (2010.01) |
| *H01L 33/04* | (2010.01) |
| *H01L 33/14* | (2010.01) |
| *H01L 33/28* | (2010.01) |
| *H01L 33/30* | (2010.01) |
| *H01L 33/32* | (2010.01) |
| *H01L 33/40* | (2010.01) |

(52) U.S. Cl.
CPC .......... *H01L 33/0016* (2013.01); *H01L 33/005* (2013.01); *H01L 33/04* (2013.01); *H01L 33/14* (2013.01); *H01L 33/28* (2013.01); *H01L 33/30* (2013.01); *H01L 33/32* (2013.01); *H01L 33/40* (2013.01)

(58) Field of Classification Search
CPC ..... H01L 33/62; H01L 51/56; H01L 51/0072; H01L 2251/301; H01L 43/08
USPC .............................. 257/43, 79, 99; 438/22, 45
See application file for complete search history.

(56) References Cited

U.S. PATENT DOCUMENTS

| | | |
|---|---|---|
| 5,600,158 A | 2/1997 | Noto et al. |
| 6,781,147 B2 | 8/2004 | Chen et al. |
| 7,026,653 B2 | 4/2006 | Sun |
| 7,834,373 B2 | 11/2010 | Feng et al. |
| 7,998,771 B2 | 8/2011 | Bae |
| 2005/0110029 A1 | 5/2005 | Aoyagi et al. |
| 2005/0173724 A1* | 8/2005 | Liu .......... H01L 33/42 257/103 |
| 2007/0069234 A1 | 3/2007 | Won et al. |
| 2008/0251781 A1 | 10/2008 | Han et al. |
| 2010/0240162 A1 | 9/2010 | Bae |
| 2011/0193057 A1 | 8/2011 | Sabathil et al. |
| 2012/0280258 A1* | 11/2012 | Yeh .......... H01L 33/007 257/88 |

* cited by examiner

*Primary Examiner* — Andy Huynh
(74) *Attorney, Agent, or Firm* — Seed IP Law Group PLLC

(57) ABSTRACT

A light emitting device comprising a plurality of current spreading layers including a first P doped layer, a first N doped layer and a second P doped layer, wherein the N doped layer having a doping level and thickness configured for substantial depletion or full depletion.

20 Claims, 13 Drawing Sheets

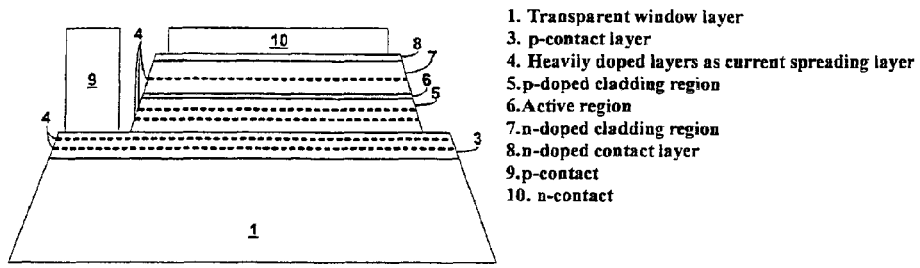
FIGURE 1 (Prior Art: US 7,026,653 B2)
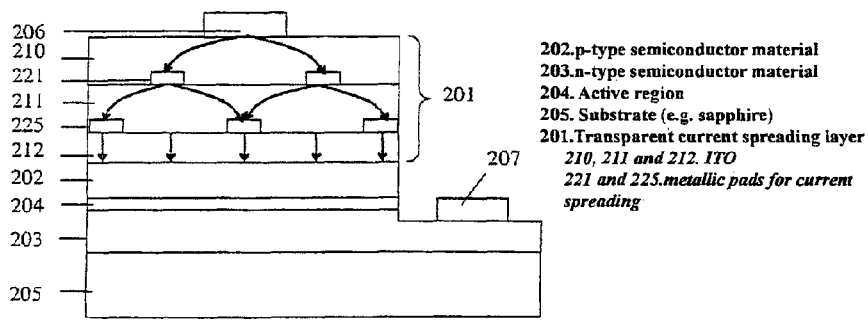
FIGURE 2 (Prior Art: US 7,834,373 B2)
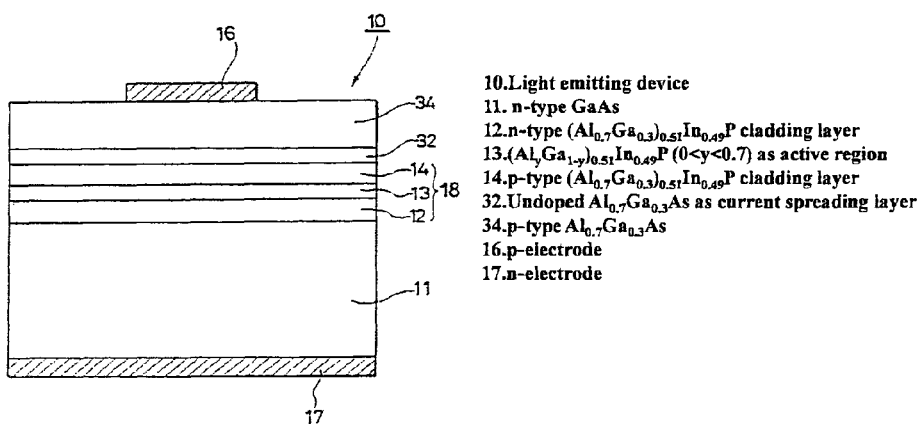
FIGURE 3 (Prior Art: 5,600,158)

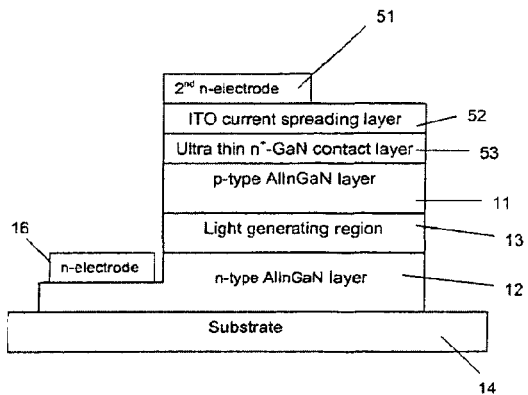

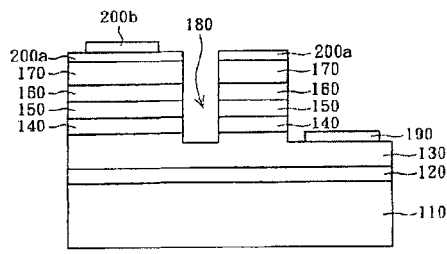

FIGURE 5A

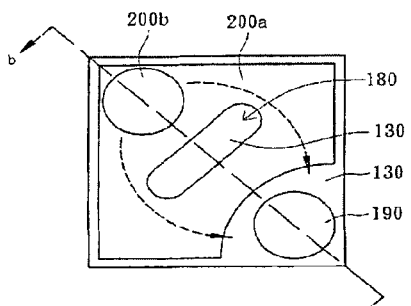

FIGURE 5B

110. Substrate (e.g. sapphire)
120. Buffer layer (e.g. GaN, AlN)
130. First-polarity (AlxGa1-x)yIn1-yN
140. First-polarity (AlxGa1-x)yIn1-yN cladding layer
150. Active layer of AlxGa1-x)yIn1-yN
160. Second-polarity AlxGa1-x)yIn1-yN cladding layer
170. Highly doped contact layer for second polarity made of AlxGa1-x)yIn1-yN
200a. transparent electrode of second polarity
200b. Metal electrode pad of second polarity
180. Trench for current spreading

Device A: reference LED w/o transparent current spreading layer

Device B: PNP-LED w/o transparent current spreading layer

| Current (mA) | Current density (A/cm²) |
|---|---|
| 10 | 8.16 |
| 20 | 16.33 |
| 30 | 24.49 |
| 40 | 32.65 |
| 50 | 40.82 |

Device A: reference LED w/o transparent current spreading layer

Device B: PNP-LED w/o transparent current spreading layer $T_c$: carrier temperature Device A: reference LED w/o transparent current spreading layer Device B: PNP-LED w/o transparent current spreading layer Device A: reference LED w/o transparent current spreading layer Device B: PNP-LED w/o transparent current spreading layer Device A: reference LED with ITO as current spreading layer Device B: PNP-LED with ITO as current spreading layer

| Current (mA) | Current density (A/cm²) |
|---|---|
| 10 | 8.16 |
| 20 | 16.33 |
| 30 | 24.49 |
| 40 | 32.65 |
| 50 | 40.82 |

Device A: reference LED with ITO as current spreading layer

Device B: PNP-LED with ITO as current spreading layer $T_c$: carrier temperature Device A: reference LED with ITO as current spreading layer
Device B: PNP-LED with ITO as current spreading layer Device A: reference LED with ITO as current spreading layer
Device B: PNP-LED with ITO as current spreading layer Device A: reference LED with ITO as current spreading layer Device B: PNP-LED with ITO as current spreading layer Device A: reference LED with ITO as current spreading layer Device B: PNP-LED with ITO as current spreading layer

LIGHT-EMITTING DEVICE

FIELD

The present invention relates to light emitting diodes (LEDs), and more particularly, to a structure of lateral current spreading architecture in LEDs.

BACKGROUND

In the past decades, tremendous progress has been made in InGaN/GaN light emitting diodes (LEDs). One remaining issue is that the performance is still limited by the p-type GaN layer. Due to the low doping concentration and low hole mobility of p-type GaN (poor electric conductivity), the current crowding effect becomes very significant especially at high-current operation. The direct consequences of the current crowding underneath the p-type GaN electrode include creating a high localized heat and localized carrier concentration. This has caused the increase of non-radiative recombination rates in the multiple-quantum wells (MQWs) and thus degrading the optical output power and external quantum efficiency (EQE).

In order to alleviate the undesirable current crowding effect, several technologies have been developed. Sun et. al. proposed the current spreading layer by heavily doping the semiconductor layers (layer 3, 5 and 7 in FIG. 1). The heavily doped layer enables higher conductivity if excellent crystal quality can be preserved. Later on, it is also suggested by Feng et. al. that the metallic pads (label 221 and 225 in FIG. 2) are inserted in the transparent current spreading layers (label 210, 211 and 212 in FIG. 2) to symmetrize the lateral current as indicated in FIG. 2. Particularly, current crowding effect can be suppressed if a highly resistive layer is included, such as undoped $Al_{0.7}Ga_{0.3}As$ (layer 32 in FIG. 3) utilized in the Zn-doped p-type $Al_{0.7}Ga_{0.3}As$ (layer 34 in FIG. 3) for the vertical GaAs based LEDs, which is shown in FIG. 3. Meanwhile, it is reported that current can be homogeneously distributed by considering the physical principle of inter-band tunnelling, and hereby, the transparent current spreading (layer 52 in FIG. 4) on the ultra-thin $n^+$-GaN layer (layer 53 in FIG. 4) for a better current spreading is developed and shown in FIG. 4. On a separate proposed technology, a trench (label 180 in FIG. 5A) is designed in the current path of LEDs to locally block the current and improve the current distribution as shown in FIGS. 5A and 5B. On the other hand, hexagonal III-V nitride grown along polar orientation is featured with strong polarization fields, which are able to form a two-dimensional electron gas (2DEG) and two-dimensional hole gas (2DHG) with high sheet charge density in the heterojunction (i.e., AlGaN/GaN), and this feature can serve as a current spreading layer, as shown in FIG. 6. Last but not least, the current spreading layer can also be achieved by combining undoped AlGaN, undoped GaN, n-type AlGaN and n-type GaN (label 4 in FIG. 7), which not only employs the feature of 2DEG but also generates the energy band variation through alloying technology.

SUMMARY

In general terms the invention proposes a light emitting device with an improved current spreading layer. The current spreading layers are lattice matched epitaxially deposited PNP layers. The thickness and doping of the N layer is selected so that the N layer is completely depleted by the neighbouring P layers. As a result the dopants in the N layer become ionized and act as hole spreaders. Together with the hole blocking effect of the first PN junction, this results in an overall efficient current spreading operation without voltage consumption or minority carrier loss. This may have the advantage(s) of being more efficient at current spreading than ITO, higher radiative recombination rates, lower temperature, higher output, higher efficiency, and/or lower fabrication cost.

In a first specific expression of the invention there is provided a light emitting device comprising
- a plurality of current spreading layers including a first P doped layer, a first N doped layer and a second P doped layer,
- wherein the N doped layer having a doping level and thickness configured for substantial depletion or full depletion.
- Wherein a thickness of a depletion region in the current spreading layers may be between 0 nm to 300 nm under equilibrium.
- Wherein the thickness of the depletion region may be between 0 nm-178.37 nm under equilibrium.
- Wherein a thickness of the N doped layer is smaller than the depletion region thickness under equilibrium or non-equilibrium.
- Wherein the thickness of the N doped layer may be greater than 1 nm.
- Wherein a built-in voltage of the first N doped layer may be greater than a reach-through breakdown voltage.
- Wherein the build-in voltage may be approximately 3.2V and the reach-through breakdown voltage may be approximately 0.08V.
- Wherein a diffusion length may be determined according to $$L_D = \sqrt{D_p \tau_p} = \sqrt{kT\mu_p/e\tau_p}$$

where $D_p$ is a diffusion constant of holes, correlated with $\mu_p$ by Einstein relationship, and k is a Boltzman constant.
- Wherein a barrier height may be greater than 0.005 eV.
- Wherein an ideality factor may range from 1 to 7.
- Wherein dopants in the N doped layer may be configured to become ionized and act as hole spreaders when the N doped layer is substantially depleted or fully depleted.
- The device may further comprise an active layer and an electron injecting layer and wherein the plurality of current spreading layers may be configured to be lattice matched to the active layer and/or the electron injecting layer.
- Wherein each of the plurality of current spreading layers may comprise a semiconductor material selected from the group consisting of GaN, InGaN, AlInGaN AlInGaPAsSb, ZnO, CdSe, and any combination thereof.
- Wherein the P doped layers may be doped with a material selected from the group consisting of Be, Mg, Zn, P, N, As, Sb, and any combination thereof.
- Wherein the first N doped layer may be doped with a material selected from the group consisting of Si, Ge, O, Ga, Al, and any combination thereof.

A Mg doping level of the P doped layers may be above an intrinsic carrier concentration and a Si doping of the first N doped layer may be above an intrinsic carrier concentration.

The device may further comprise a transparent current spreading layer on the plurality of current spreading layers, the transparent current spreading layer may be selected from the group consisting of Indium Tin Oxide (ITO), Gallium doped ZnO (GZO), Aluminium doped ZnO (AZO), Fluorine Tin Oxide (FTO), Graphene and any combination thereof.

The device may alternatively further comprise a semi-transparent current spreading layer on the plurality of current spreading layers, the semi-transparent current spreading layer may comprise alloyed Ni/Au.

Wherein the plurality of current spreading layers may further comprise a second N doped layer and a third P doped layer.

The device may further comprise a plurality of further N doped layers and P doped layers.

Wherein the N doped layer may be configured to be fully depleted, a minority carrier diffusion length may be shorter than an n-type layer thickness, and a reach-through breakdown voltage for the n-type layer may be configured to be provided by an external applied bias.

In a second specific expression of the invention there is provided a method of fabricating a light emitting device comprising:
epitaxially depositing a first P type current spreading layer on or adjacent to an active layer,
epitaxially depositing a first N type current spreading layer on or adjacent to the first P type layer,
epitaxially depositing a second P type current spreading layer on or adjacent to the first N type layer, and
activating dopants in the first and second P type layers.

Wherein epitaxially depositing may comprise metal-organic chemical vapour deposition (MOCVD), molecular beam epitaxy (MBE), hydride vapour phase epitaxy (HYPE), phase-locked epitaxy (PLE), and any combined growth methods thereof.

Wherein depositing the first and second P type layers and first N type layer may be at a lower temperature compared to a temperature for depositing an electron injecting layer.

Wherein depositing the first and second P type layers and first N type layer may be at the same temperature or a higher temperature compared to a temperature for depositing an electron injecting layer.

In a third specific expression of the invention there is provided a light emitting diode comprising
a PNP semiconductor material current spreading layer,
wherein a N-type semiconductor is configured to be completely or substantially depleted, leaving ionized Si atoms acting as current spreaders, wherein the PNP layer consumes no minority carriers, as a thickness of the N-type material is smaller than a diffusion length of minority carriers, and wherein a depletion voltage in the PNP layer exceeds a reach-through breakdown voltage minimising a voltage loss in the PNP layer.

BRIEF DESCRIPTION OF THE DRAWINGS

One or more embodiments will be described with the reference of the below drawings, in which, FIGS. 1 to 7 are cross sectional diagrams of prior art current spreading layers on LEDs.

FIG. 9A is an equivalent circuit diagram of the conventional InGaN/GaN LED grown on an insulating substrate (e.g., sapphire) with lateral current-injection scheme ($I_1 > I_2 > I_3 > I_4 > \ldots > I_n$), without transparent current spreading layer.

FIG. 9B is a simplified equivalent circuit diagram of a first embodiment PNP-GaN current spreading layer InGaN/GaN LED with possible current paths (J1 and J2).

DETAILED DESCRIPTION

Figure 8:
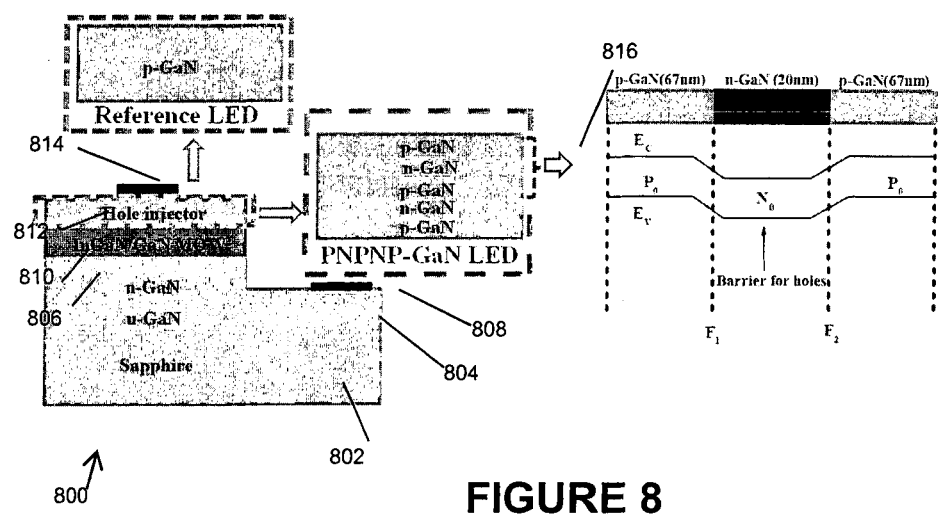
FIG. 8 is a cross sectional diagram of a PNP-GaN current spreading layer on InGaN/GaN LEDs (Device B), together with a reference LED without transparent current spreading layer (Device A).

A first embodiment shown in FIG. 8, includes an LED device 800. The device 800 is formed from GaN and deposited on a sapphire substrate 802. N doped electron injector layers 804,806 are provided on the substrate 802. An active light emitting layer 810 is sandwiched between the electron injector layers 804,806 and hole injecting layers 812. An N type electrode (cathode) is located on the n-GaN layer 806 and a P type electrode (anode) 814 is located on the hole injecting layer 812.

The hole injecting layer 812 is provided in the first embodiment as PNP current spreading layers 816. For example there may be a single p-GaN/n-GaN/p-GaN structure or there may be multiple structures such as the double p-GaN/n-GaN/p-GaN/n-GaN/p-GaN structure shown in FIG. 8.

Figure 17:
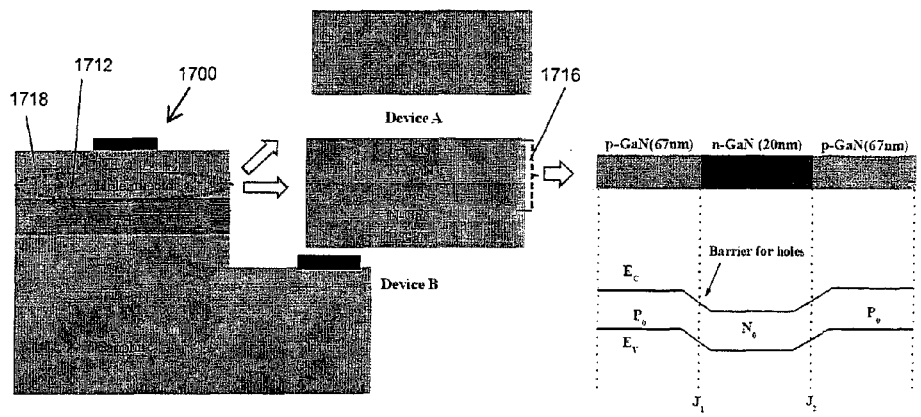
FIG. 17 is a cross sectional diagram of Device B according to a second embodiment, while Device A listed as the reference (Device A: reference LED with transparent current spreading layer; Device B: PNP-LED with transparent current spreading layer).

A second embodiment shown in FIG. 17, includes an LED device 1700. The device 1700 is formed similarly to device 800, but includes an ITO layer 1718 on top of the hole injecting layer 1712.

Embodiments may seek to suppress the current crowding effect by utilising the PNP current spreading layer 816 into the device 800. The adjacent P-GaN layers completely deplete the thin n-GaN layer. This may positively ionise Si dopants, which may act as excellent hole spreaders.

Current Spreading Effect

FIGS. 8 and 17 shows the schematic energy band diagram of the PNP-GaN layer 816 1716. The first junction $F_1$ in the PNP-GaN region reduces the vertical transport of holes while enhancing the lateral transport. As will be described in later sections the N-GaN layer may in one embodiment be designed thin enough so that the depletion region, diffusion length are larger than the thickness and so that the reach through break down voltage is lower than the built in voltage. Also it may in one embodiment be thick enough that it provides sufficient hole blocking and thus has a hole barrier height above a required level. The doping level of the N-GaN region may also be simultaneously designed to achieve this.

Put another way the thickness and the doping level of the N-GaN layer(s) may designed to address full depletion, no carrier loss, and/or hole barriers high enough for currents spreading.

For InGaN/GaN LEDs grown on insulating substrates with lateral current-injection scheme, the current travels both vertically and laterally as indicated in FIG. 9(a). As the sheet resistance of n-GaN is much smaller than the sheet resistance of p-GaN, the current tends to flow through the low-resistivity n-GaN layer (FIG. 9(a)), giving a non-uniform current distribution in p-GaN (i.e., $I_1 > I_2 > I_3 > I_4 \ldots > I_n$), well known as the current crowding effect. This current crowding effect can be suppressed if PNPNP-GaN is employed in the LED architecture. A simplified equivalent circuit of InGaN/GaN LEDs with the embedded PNPNP-GaN homojunctions is depicted in FIG. 9(b), in which the total current is divided into vertical current ($J_1$) and horizontal current ($J_2$). The total voltage drop consists of those in the p-contact, p-GaN, MQW region, n-GaN as well as n-contact. Based on the equivalent circuit in FIG. 9(b), Eq. 1 (for current path 1) and Eq. 2 (for current path 2) are obtained.

$$J_1 lw \frac{\rho_{p\text{-}GaN} t_p}{lw} + J_1 lw \frac{N \cdot \rho_{PNP}}{lw} + V_{pn} + V_{p\text{-}contact} + \qquad (1)$$

$$V_{n\text{-}contact} + J_1 lw \frac{\rho_{n\text{-}GaN} l}{w t_n} + (J_1 lw + J_2 w t_p) \frac{\rho_{n\text{-}GaN} l_0}{w t_n} = U$$

$$J_2 w t_p \frac{\rho_{p\text{-}GaN} l}{t_p w} + J_2 w t_p \frac{\rho_{p\text{-}GaN} t_p}{lw} + J_2 w t_p \frac{N \cdot \rho_{PNP}}{lw} + \qquad (2)$$

$$V_{pn} + V_{p\text{-}contact} + V_{n\text{-}contact} + (J_1 lw + J_2 w t_p) \frac{\rho_{n\text{-}GaN} l_0}{w t_n} = U$$

where l represents the length of the lateral current path, $l_0$ is the distance from the mesa edge to the center of the n-contact, and w is the length of the stripped p-contact. The thickness of p-GaN and n-GaN is $t_p$ and $t_n$, respectively; $\rho_{p\text{-}GaN}$ and $\rho_{n\text{-}GaN}$ is the resistivity for p-GaN and n-GaN, respectively; $V_{pn}$ denotes the junction voltage drop of multiple quantum wells in InGaN/GaN LED; and $V_{p\text{-}contact}$ and $V_{n\text{-}contact}$ are the voltage drops across the p-contact and n-contact, respectively. $\rho_{PNP}$ is the specific interfacial resistivity induced by the barrier height in each PNP-GaN junction. N is the total number of PNP-GaN junction, and in our device, there are two PNP-GaN junctions (i.e., PNPNP-GaN), and thus N is 2 (i.e., the total interfacial specific resistivity is $2 \times \rho_{PNP}$).

By equating Eq. (1) and Eq. (2), Eq. (3) is derived. However, l is in the order of device mesa size, which is 350 μm×350 μm, while $t_p$ is the scale of p-GaN thickness, which is ~200 nm. Since $t_p \ll l$, then Eq. (3) can be simplified into Eq. (4).

$$\frac{J_1}{J_2} = \frac{l}{t_p + \frac{N \cdot \rho_{PNP}}{\rho_{p\text{-}GaN}}} + \frac{t_p}{l} \qquad (3)$$

$$\frac{J_1}{J_2} \cong \frac{l}{t_p + \frac{N \cdot \rho_{PNP}}{\rho_{p\text{-}GaN}}} \qquad (4)$$

Equation (4) shows that a higher ratio of $N \cdot \rho_{PNP}/\rho_{p\text{-}GaN}$ is beneficial for enhancing the lateral current (i.e., $J_2$). To increase the ratio of $N \cdot \rho_{PNP}/\rho_{p\text{-}GaN}$, either $N \cdot \rho_{PNP}$ has to be increased or $\rho_{p\text{-}GaN}$ has to be reduced. It is also feasible to increase the lateral current flow by increasing the p-GaN layer thickness ($t_p$).

Figures 18A, 18B:
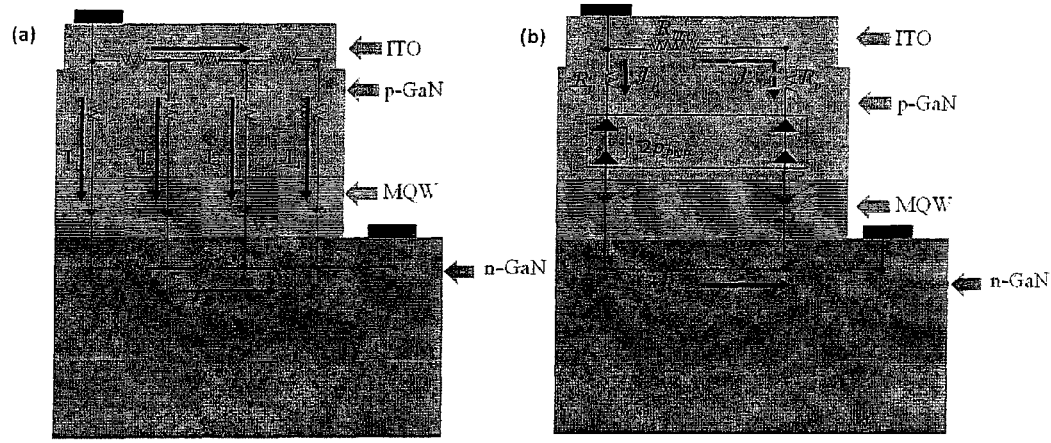
FIG. 18A is an equivalent circuit diagram for Device B (Device B: PNP-LED with transparent current spreading layer).
FIG. 18B is a simplified equivalent circuit diagram for Device B (Device B: PNP-LED with transparent current spreading layer).

FIG. 18B depicts the simplified equivalent circuit of InGaN/GaN LED with transparent current spreading layer (i.e., ITO). In the case of PNPNP-GaN incorporated as the current spreading layer, we divide the total current into the vertical portion ($J_1$) and the horizontal portion ($J_2$). Similar to the devices without transparent current spreading layer, the total voltage drop consists of those between ITO and Ti/Au in the p-contact, p-GaN, MQW region, n-GaN as well as the n-contact. Based on the equivalent circuit in FIG. 18($b$), Eq. (5) (for current path 1) and Eq. (6) (for current path 2) are obtained.

$$J_1 lw \frac{\rho_{p\text{-}GaN} t_p}{lw} + J_1 lw \frac{N \cdot \rho_{PNP}}{lw} + V_{pn} + V_{p\text{-}contact} +$$
$$V_{n\text{-}contact} + J_1 lw \frac{\rho_{n\text{-}GaN} l}{w t_n} + (J_1 lw + J_2 w_{ITO} t_{ITO}) \frac{\rho_{n\text{-}GaN} l_0}{w t_n} = U \quad (5)$$

$$J_2 w_{ITO} t_{ITO} \frac{\rho_{ITO} l}{t_{ITO} w_{ITO}} + J_2 w_{ITO} t_{ITO} \frac{\rho_{p\text{-}GaN} t_p}{lw} + J_2 w_{ITO} t_{ITO} \frac{N \cdot \rho_{PNP}}{lw} +$$
$$V_{pn} + V_{p\text{-}contact} + V_{n\text{-}contact} + (J_1 lw + J_2 w_{ITO} t_{ITO}) \frac{\rho_{n\text{-}GaN} l_0}{w t_n} = U \quad (6)$$

where l represents the length of the lateral current path, $l_0$ is the distance from the mesa edge to the center of the n-contact, and w is the width of the device mesa. $t_{ITO}$ and $w_{ITO}$ is the thickness and width of the ITO film (in our case, w=350 μm and $w_{ITO}$=330 μm), respectively, and $\rho_{ITO}$ is the ITO resistivity. The thickness of p-GaN and n-GaN is $t_p$ and $t_n$, respectively; $\rho_{p\text{-}GaN}$ and $\rho_{n\text{-}GaN}$ is the resistivity for p-GaN and n-GaN, respectively; $V_{pn}$ denotes the junction voltage drop of multiple quantum wells in InGaN/GaN LED; and $V_{p\text{-}contact}$ and $V_{n\text{-}contact}$ are the voltage drops across the p-contact (Ti/Au on ITO) and n-contact, respectively. $\rho_{PNP}$ is the specific interfacial resistivity induced by the barrier height in each PNP-GaN junction. N is the total number of PNP-GaN junction, and in our device, we have two PNP-GaN junctions (i.e., PNPNP-GaN), and thus N is 2 (i.e., the total interfacial specific resistivity is 2×$\rho_{PNP}$).

By equating Eq. (5) and Eq. (6), Eq. (7) is derived. However, l, w and $w_{ITO}$ are in the order of the device mesa size, which is 350 μm×350 μm, while $t_{ITO}$ is 200 nm ($t_{ITO}$<<l), then Eq. (7) can be simplified into Eq. (8).

$$\frac{J_1}{J_2} = \frac{w_{ITO} t_{ITO}}{lw} + \frac{l}{\frac{\rho_{P\text{-}GaN}}{\rho_{TCL}} t_p + \frac{N \cdot \rho_{PNP}}{\rho_{TCL}}} \quad (7)$$

$$\frac{J_1}{J_2} \cong \frac{l}{\frac{\rho_{P\text{-}GaN}}{\rho_{TCL}} t_p + \frac{N \cdot \rho_{PNP}}{\rho_{TCL}}} \quad (8)$$

Equation (8) shows that a higher ratio of $N \cdot \rho_{PNP}/\rho_{TCL}$ helps to enhance the lateral current (i.e., $J_2$). Therefore, either $N \cdot \rho_{PNP}$ has to be increased or $\rho_{TCL}$ has to be reduced for an increased ratio of $N \cdot \rho_{PNP}/\rho_{TCL}$. Meanwhile, the current spreading effect will also be improved by properly increasing the p-GaN thickness ($t_p$).

Furthermore, the PNPNP-GaN will not have very abrupt interfaces because of the dopant diffusion, especially the Mg diffusion. However, one still can maintain the PNPNP-GaN junctions by properly increasing the Si doping concentration and/or the n-GaN thickness. Through this, the junction barrier (i.e., $\rho_{PNP}$) in each PNP-GaN can be formed, and Eq. 3, Eq. 4, Eq. 7 and Eq. 8 are still valid to explain the current spreading.

Meanwhile, the n-GaN doping and n-GaN thickness have to follow the design guidelines, which were addressed previously, such that n-GaN has to be completely depleted and the reversed junction $F_2$ will not block any current.

Device Fabrication

An embodiment may be fabricated with two PNP-GaN junctions, for example with the total thickness of p-GaN for Devices A and B in FIGS. 8 and 17 to be 200 nm, that is excluding the thickness of the n-GaN. However, more PNP-GaN period can be incorporated and optimized according to its thickness and dopant concentration in the n-GaN and p-GaN regions, respectively.

Two sets of InGaN/GaN LED wafers (i.e., Reference LED and PNPNP-GaN LED sketched in FIG. 8) were grown by an AIXTRON close-coupled showerhead metal-organic chemical vapour deposition (MOCVD) reactor on c-plane patterned-sapphire substrates. TMGa/TEGa/TMIn and $NH_3$ were used as the group-III sources and the group-V sources, respectively. Diluted $Cp_2Mg$ and $SiH_4$ were used as the dopant precursors for p-type and n-type GaN, respectively. The growth was initiated from a 30 nm low-temperature GaN buffer layer, then followed by a 2 μm u-GaN layer and a 4 μm n-GaN layer ($N_d$=5×$10^{18}$ $cm^{-3}$), which were both grown at 1050° C. In the grown LED epi-samples, the active layer consists of five-period $In_{0.15}Ga_{0.75}N$/GaN multiple quantum wells (MQWs), with well and barrier thickness of 3 nm and 12 nm, respectively. The wells and barriers were grown at the same temperature of 730° C. The Reference LED has a 0.2 μm thick p-GaN layer with a hole concentration of 3×$10^{17}$ $cm^{-3}$. By inserting two 20 nm n-GaN ($N_d$=2×$10^{17}$ $cm^{-3}$) layers into p-GaN layer evenly, we obtained the PNPNP-GaN structure (0.067 μm 20 nm/0.067 μm 20 nm/0.067 μm) with the same thickness of the p-GaN layer in the reference device. The PNPNP-GaN layers were all grown at 1020° C., which was lower than the temperature (1050° C.) used for the growth of u-GaN and n-GaN layers to suppress the out-diffusion of the InN from the InGaN quantum wells. Specifically, the growth pressure for the n-GaN and p-GaN in the PNPNP-GaN structure was set to 150 mbar. The V/III ratio ($NH_3$/TMGa) during PNPNP-GaN growth was kept to be 4100. After the epi-wafers were grown, we performed the thermal annealing to activate the Mg dopants for p-GaN layers. The annealing was conducted for 10 min in the ambient of $N_2$ at a temperature of 720° C. for both the Reference LED and PNPNP-GaN LED wafers.

After the LED wafers were grown, four sets of LED chips were fabricated by following the standard fabrication process. The epi-wafers were patterned into mesas of size 350 μm×350 μm through reactive ion etch (RIE). Ni/Au film (10 nm150 nm) was first deposited as the p-electrode, and then the p-contact was annealed in the mixture of $O_2$ and $N_2$ at 515° C. for 5 min under the atmosphere pressure. Finally, Ti/Au (30 nm/150 nm) was deposited as the n-electrode. We have prepared two sets of devices without indium tin oxide (ITO) coating (i.e., the Reference LED without ITO and PNPNP-GaN LED without ITO). The other two sets were prepared with ITO coating as the transparent current spreading layer (i.e., Reference LED with ITO and PNPNP-GaN LED with ITO, which are shown in the supplementary material). The transparent current spreading layer (i.e., ITO) was sputtered and annealed in the ambient of N2 at 500° C. for 120 s before depositing electrodes. Also, we performed numerical simulations for the four sets of devices in APSYS, which solves the Poisson equation, continuity equation and Schrödinger equation with proper boundary conditions. The Auger recombination coefficient used in these simulations was 1×$10^{-30}$ $cm^6 s^{-1}$, and the energy band offset between the conduction band and the valence band was 70/30. Considering the crystal relaxation by generating dislocations, 40% of the theoretical polarization charge was assumed. Other parameters can be found in I. Vurgaftman and J. R. Meyer, "Band parameters for nitrogen-containing semiconductors," J. Appl. Phys. 94(6), 3675-3696 (2003) which is incorporated herein by reference.

The InGaN/GaN LEDs coated with ITO films as the external transparent current spreading layers (i.e., Reference LEDs with ITO coatings and PNPNP-GaN LED with ITO coatings), shown in FIG. 17 were also fabricated using a similar process. A 200 nm thick ITO film was sputtered on each device and then annealed in the ambient environment of $N_2$ at 500° C. for 120 s. In these devices, the deposited Ti/Au (30 nm/150 nm) contacts were used as the p-electrode and n-electrode, respectively.

The doping concentration of p-GaN (67 nm) is $3 \times 10^{17}$ $cm^{-3}$ and $2 \times 10^{17}$ $cm^{-3}$ for the thin n-GaN (20 nm).

Depletion Region

As indicated in FIGS. 8 and 17, the PNPNP-GaN LEDs (i.e., PNPNP-GaN LED without ITO and PNPNP-GaN LED with ITO) own two layers of thin n-GaN (20 nm), sandwiched between 67 nm thick p-GaN layers. Each thin n-GaN forms two junctions at the interfaces (i.e., $F_1$ and $F_2$). When the InGaN/GaN LED is forward biased, $F_1$ is also forward biased, whereas $F_2$ is reversely biased. As the applied bias increases, the depletion region of $F_1$ shrinks, while $F_2$ extends its depletion region across the n-GaN. Thereby, the depletion region in the entire n-GaN layer can be retrieved, thus with the ionized Si donors here acting as the hole spreaders. With the doping concentration of n-GaN ($2 \times 10^{17}$ $cm^{-3}$) and p-GaN ($3 \times 10^{17}$ $cm^{-3}$), the built-in potential in the p-GaN/n-GaN is 3.23 V $$\left( V_{bi} = \frac{kT}{e} \ln\left(\frac{N_A N_D}{n_i^2}\right) \right),$$

e is the elementary electronic charge, and $n_i = 1.9 \times 10^{-10}$ $cm^{-3}$ for GaN). The total depletion region thickness is 162.83 nm $$\left( W_T = \sqrt{\frac{2\varepsilon_r \varepsilon_0}{e}\left(\frac{N_A + N_D}{N_A N_D}\right) V_{bi}} \right),$$

$\varepsilon_r = 8.9$ for GaN, and $\varepsilon_o$ is the absolute dielectric constant), which consists of the depletion region in n-GaN and p-GaN of 97.70 and 65.13 nm, respectively, provided that n-GaN and p-GaN have infinite lengths. Therefore, the n-GaN layer, which has a thickness of only 20 nm, is fully depleted in PNPNP-GaN LEDs. Meanwhile, according to the principle of charge neutrality in the depletion region of a homojunction, the actual depletion width in p-GaN of the PNP-GaN junction is only about 13.33 nm.

The depletion region width may be larger than the n-GaN thickness and therefore, a reduced forward voltage can be obtained for the device. Alternatively, the depletion region width can also be smaller than the n-GaN thickness, and the full depletion of n-GaN can be facilitated by the external applied bias. However this might lead to an increased forward voltage of the device.

For example the depletion region may be between 0 nm-178.37 nm under equilibrium. If the p-GaN carrier concentration ($N_A$) can be ideally higher than the n-GaN carrier concentration ($N_D$), i.e., $N_D \ll N_A$, and we can assume $N_D = 1 \times 10^{17}$ $cm^{-3}$, which is comparable to the u-GaN (i.e., unintentionally n-doped GaN by oxygen and/or nitrogen vacancy) carrier concentration, then the thickness has to be smaller than 178.37 nm for full depletion of n-GaN under equilibrium. For other typical material systems the thickness and the doping levels are closely correlated with each other and may be chosen first. The thickness of the depletion region may be between 0 nm to 300 nm under equilibrium for any other non nitride material system.

Diffusion Length

The n-GaN thickness may be smaller than the diffusion length of the minority carriers, i.e., holes in this case. The diffusion length is turn may depend on the doping concentration of the n-GaN layer.

The diffusion length ($L_D$) of holes in the n-GaN can be obtained by using $L_D = \sqrt{D_p \tau_p} = \sqrt{kT\mu_p/e\tau_p}$ (where $D_p$ is the diffusion constant of holes, correlated with $\mu_p$ by Einstein relationship, and k is the Boltzman constant). Here, the minority carrier (hole) lifetime in n-GaN with a doping concentration of $2 \times 10^{17}$ $cm^{-3}$ is assumed to be 0.8 ns, while the hole mobility is set to be 26 $cm^2/Vs$. The $\mu_p$ and $t_p$ may be measured by electron beam induced current (EBIC) under different n-GaN doping levels or empirical estimates may be used. Thus, the diffusion length for holes is calculated to be ~231.9 nm, which is much larger than the thickness of n-GaN (20 nm) in each PNP-GaN junction of the PNPNP-GaN LED. As a result, there will be no minority carrier (hole) loss across the n-GaN region. Again, this translates to the improved carrier injection (holes injection in this case) at no consumption of extra electricity power.

The diffusion length of the minority carrier depends on the doping concentration and the dislocation density. The dislocation density has to be reduced in order to keep a long diffusion length. The diffusion length may be larger than the n-GaN thickness for no carrier loss. The diffusion length may also be smaller than the n-GaN thickness, but this may lead to the minority carrier loss.

Built-in Voltage

There exists a reach-through breakdownvoltage for the reversely biased junction (i.e., $F_2$), and the reach-through breakdown voltage is 0.08V in this case $$\left( BV_{RT} = \frac{eN_D W_N^2}{2\varepsilon_r \varepsilon_0} \right),$$

and $W_N$ is the width of n-GaN). It is worth mentioning that this $BV_{RT}$ is smaller than the built-in potential determined above within the p-GaN/n-GaN junctions, and this also manifests itself in the full depletion of n-GaN by leaving behind ionized Si dopants as the hole spreaders.

Figure 10A:
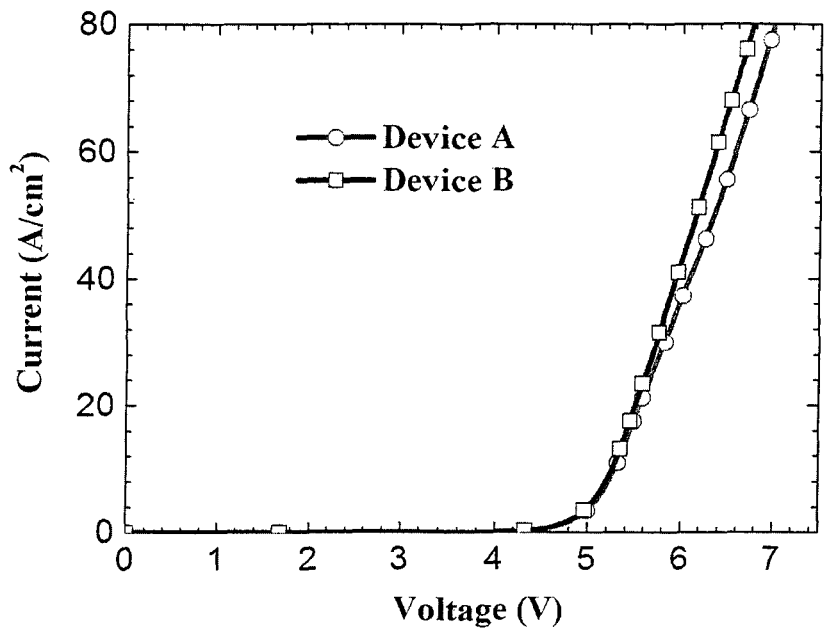
FIG. 10A is a graph of the simulated current as a function of the applied bias.
Figure 10B:
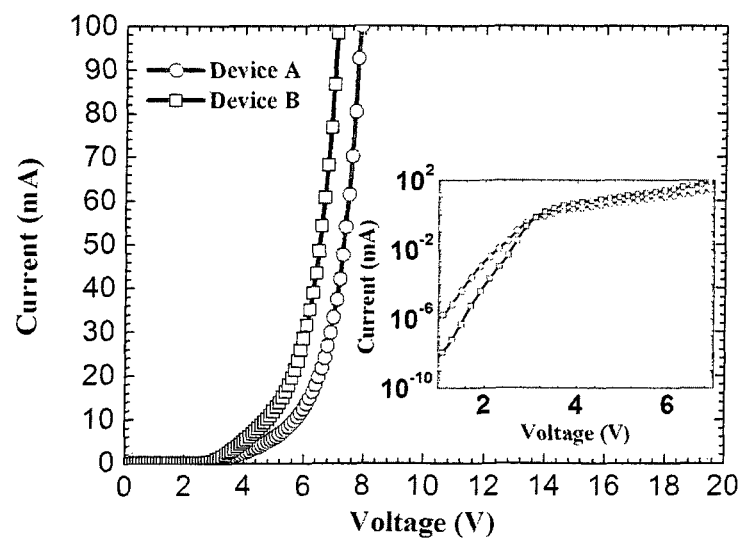
FIG. 10B is a graph of the experimentally measured current as a function of the applied bias.
Figure 19A:
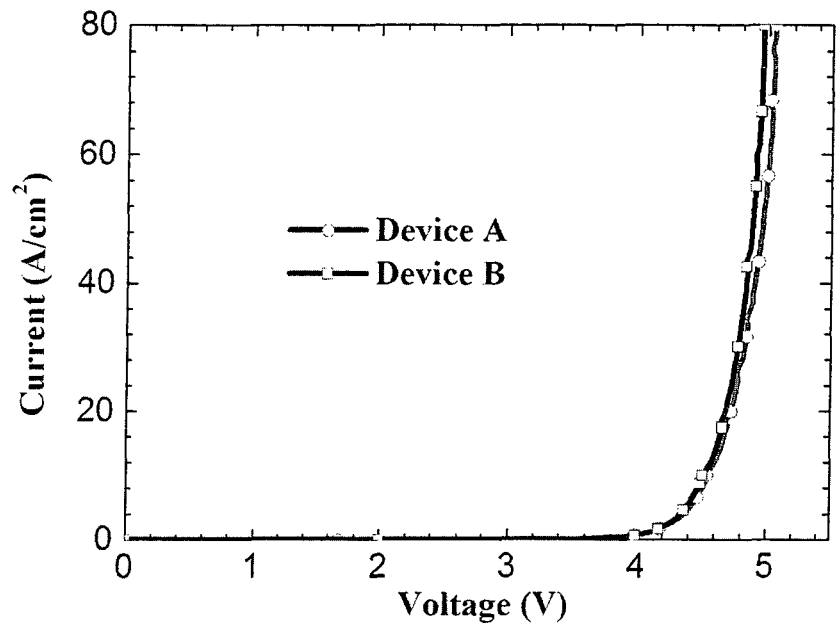
FIG. 19A is a graph of the simulated current as a function of the applied bias for Device A and B (Device A: reference LED with transparent current spreading layer; Device B: PNP-LED with transparent current spreading layer).
Figure 19B:
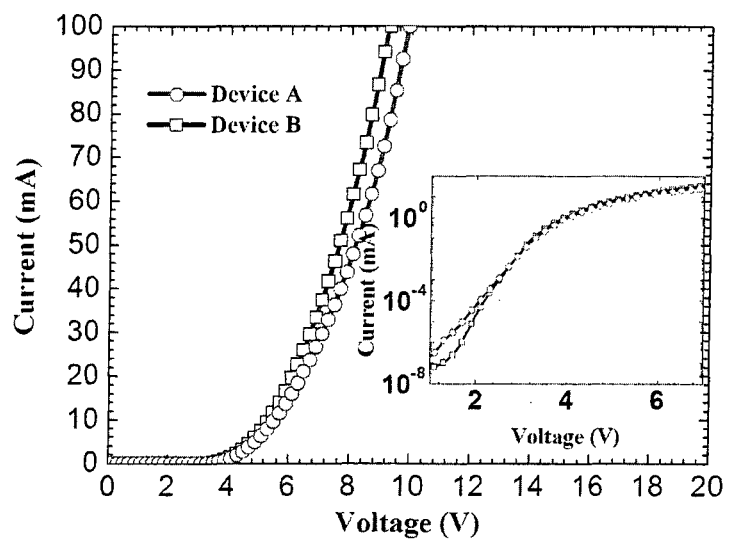
FIG. 19B is a graph of the experimentally measured current as a function of the applied bias for Devices A and B (Device A: reference LED with transparent current spreading layer; Device B: PNP-LED with transparent current spreading layer).

Therefore, after the depletion region extends through the whole n-GaN region, any further increase in the applied bias that is higher than 0.08V will promote the injection of minority carriers (i.e., holes in our case) from the forward biased junction (i.e., $F_1$), leading to an improved electrical conductivity and high-current flow. This results in no significant voltage consumption (waste of electrical power) in the PNP-GaN junction. This in turns reduces the forward bias in the PNP-GaN LEDs during operation, as shown in FIGS. 10B and 19B as compared to the conventional LEDs that are shown in FIGS. 10A and 19A, respectively.

The reach-through breakdown voltage may be smaller than 3.2V. The reach-through breakdown may extend the depletion region through the whole n-GaN layer when biasing. In this case the current can pass through. The optimum reach-through may happen before any biasing, i.e. the n-GaN has been fully depleted under equilibrium.

Equilibrium, in this case, may be understood as no external biasing being applied. Similarly non-equilibrium may be when there is biasing. In one embodiment the n-GaN may be completely depleted without any external bias; and in this way, there may be no voltage consumption in the PNPNP-GaN layers. In an alternative embodiment the n-GaN may be completely depleted after externally biasing the device, but this may result in some additional voltage drop.

Barrier Height

In order to probe the embedded PNPNP-GaN in terms of spreading current, we present the current as a function of voltage, as shown in FIGS. 10(b) and 19(b). In the low forward voltage regime [0~3V in FIGS. 10(b) and 19(b)], the PNPNP-GaN LED without ITO coating exhibits lower leakage current with respect to the Reference LED without ITO film in FIG. 10(b), while the same conclusion can be made for PNPNP-GaN LED with ITO coating with respect to its Reference LED with ITO according to FIG. 19(b). The Reference LEDs (i.e., Reference LEDs without and with ITO) and PNPNP-GaN LEDs (i.e., PNPNP-GaN LEDs without and with ITO) have the similar crystal quality, as their full-width at half-maximum (FWHM) of (102) and (002) X-ray diffraction spectra are both about 213.5 and 216.0 arcsec, respectively. Thus the suppressed leakage current in PNPNP-GaN LEDs comes from the increased junction barrier height. As the PNPNP-GaN junctions are embedded in such InGaN/GaN LEDs with multiple heterojunctions, it is therefore difficult to extract the barrier height for PNPNP-GaN. Here, we calculate the effective overall barrier height by the following, $$\phi_B = \frac{kT}{e} \ln\left(\frac{A \cdot T^2}{I_s}\right), \text{ with } I = I_s \cdot e^{\frac{eV}{nkT}} \quad (9)$$

where $\phi_B$ is the overall barrier height within the LED device, and n is the ideality factor for the diodes. $\phi_B$ is calculated to be 1.10V for Reference LED without ITO and 1.31 V for PNPNP-GaN LED without ITO, respectively. It is clearly revealed that a higher overall barrier height is obtained when PNPNP-GaN feature is integrated in the p-type layer. The ideality factor is 5.32 and 4.19 for Reference LED without ITO and PNPNP-GaN LED without ITO, respectively. An improved current spreading in PNPNP-GaN LED is responsible for the reduced ideality factor. Furthermore, because of the improved current spreading effect in PNPNP-GaN LED without ITO, the electrical performance is improved compared to Reference LED without ITO when the applied bias is higher than 3V. Similarly, $\phi_B$ is determined to be 1.33V for Reference LED with ITO and 1.44V for PNPNP-GaN LED with ITO, respectively. Moreover, the ideality factor is 6.52 and 4.51 for Reference LED with ITO and PNPNP-GaN LED with ITO, respectively. We also observed the increased overall energy barrier height in PNPNP-GaN LED with ITO, which in the meanwhile features the reduced ideality factor and the improved electrical properties compared to those in Reference LED with ITO. This is well attributed to the improved current spreading effect by the incorporation of PNPNP-GaN homojunctions.

Figure 16A:
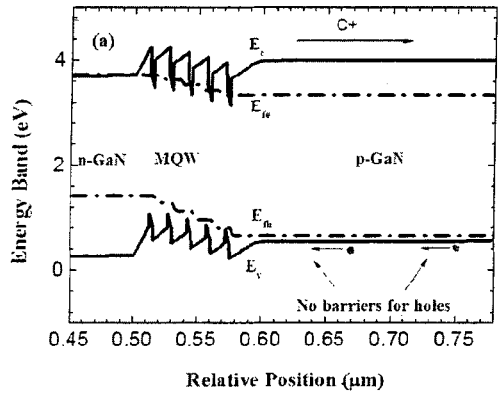
FIG. 16A is a graph of the energy band diagram for Device A (Device A: reference LED without transparent current spreading layer).
Figure 16B:
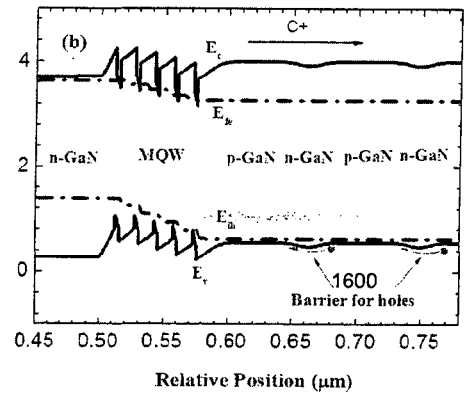
FIG. 16B is a graph of the energy band diagram for Device B (Device B: PNP-LED without transparent current spreading layer).
Figure 25A:
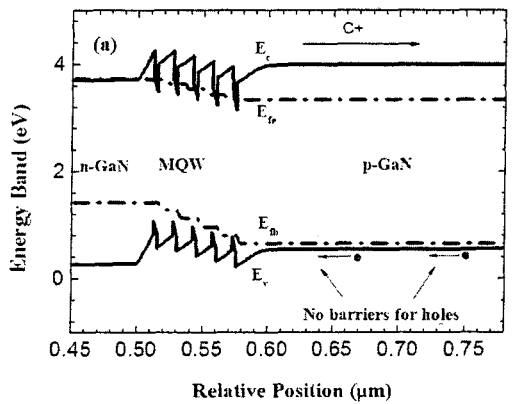
FIG. 25A is a graph of the energy band diagram for Device A (Device A: reference LED with transparent current spreading layer).
Figure 25B:
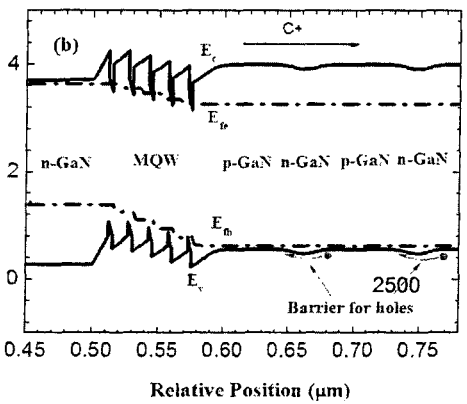
FIG. 25B is a graph of the energy band diagram for Device B (Device B: PNP-LED with transparent current spreading layer).

The energy band diagrams of Reference LEDs (i.e., Reference LED without and with ITO) and PNPNP-GaN LEDs (i.e., PNPNP-GaN LED without and with ITO) are shown in FIGS. 16(a) and 25(a), respectively. The holes in the Reference LEDs experience no barriers when transporting through p-GaN according to FIG. 16(a). In contrast, for the PNPNP-GaN LEDs, FIGS. 16B, and 25B there are two hole energy barriers 1600, 2500, which are due to the ionized Si donors in the n-GaN layers. With the aid of the hole barriers, hole spreading is enhanced, and this alleviates the hole crowding effect in InGaN/GaN LEDs and leads to an improved lateral hole distribution.

For example the barrier height may be larger than 0.005 eV. The optimum barriers height on one hand can effectively spread the current (thus, the n-GaN layer cannot be too thin), and on the other hand, it will not increase the forward voltage (the n-GaN layer cannot be too thick). The optimum may depend on the application; for example the n-GaN has been fully depleted and the reach through happens before any biasing.

However, there is no unique solution for barrier height, reach-through breakdown voltage etc. The parameters may be correlated with each other, and they are designed in each case for the requirements of the application. The primary requirement may be the n-GaN has to be fully depleted before any biasing. The doping levels and/or the thickness may be designed accordingly.

As shown in FIGS. 13, 14, 22 and 23, the increased optical power and EQE are achieved in the PNP-GaN LEDs as compared to the conventional ones. The emission spectra which are illustrated in FIGS. 11A, 11B, 20A and 20B also show the advantage of PNP-GaN LEDs over the conventional ones. On top of this, the local heat due to the current crowding has also posted serious issues for the LEDs operation and its operating lifetime. However, the local heat can be significantly reduced if PNP-GaN is inserted in the InGaN/GaN LEDs. FIG. 12 shows a lower carrier temperature in the PNP-GaN LED than in the reference LED, and carrier temperature can be further reduced once the transparent current spreading layer is added as shown in FIG. 21.

Figure 11A:
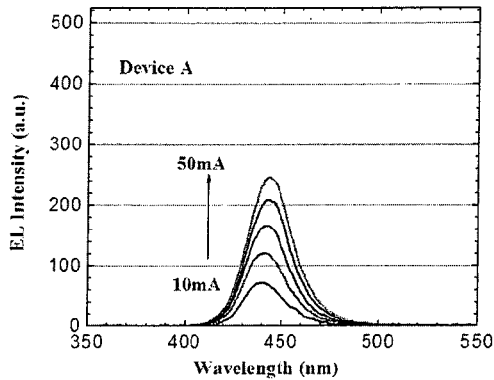
FIG. 11A is a graph of the experimentally measured emission spectra for Device A (reference LED without transparent current spreading layer).
Figure 11B:
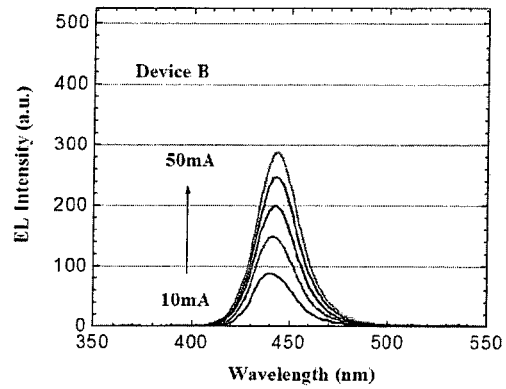
FIG. 11B is a graph of the experimentally measured emission spectra for Device B (PNP-LED without transparent current spreading layer).
Figure 12:
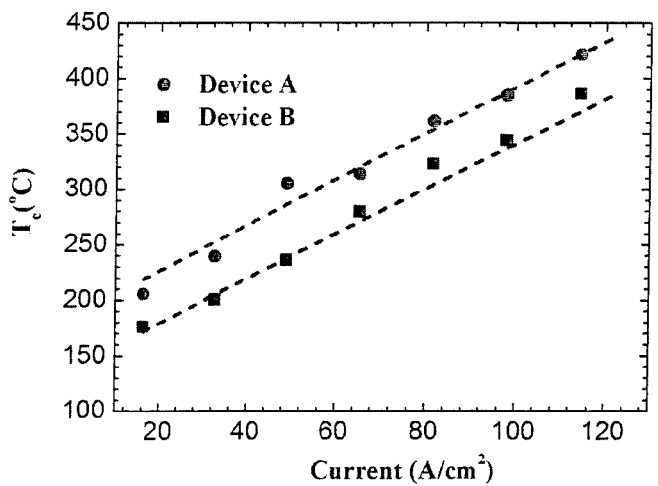
FIG. 12 is a graph of the carrier temperature under different current injection level for devices A and B (Device A: reference LED without transparent current spreading layer; Device B: PNP-LED without transparent current spreading layer).
Figure 13:
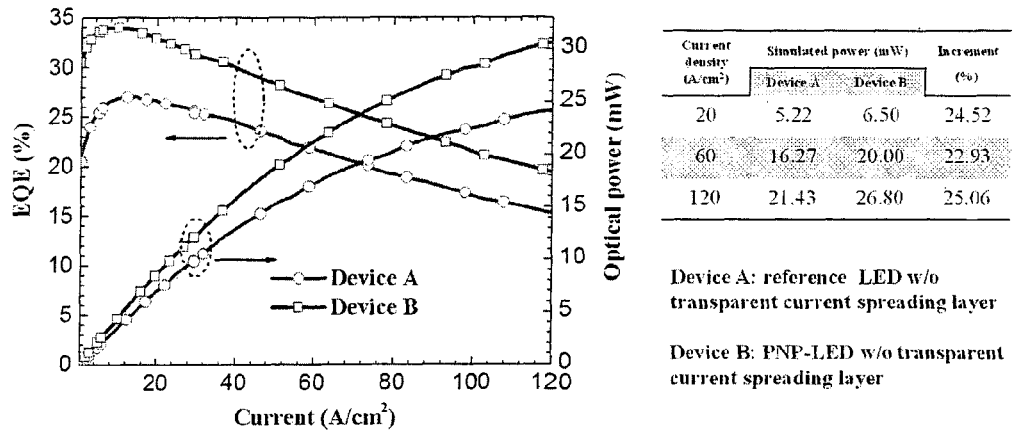
FIG. 13 is a graph of the simulated optical output power and external quantum efficiency for Devices A and B (Device A: reference LED without transparent current spreading layer; Device B: PNP-LED without transparent current spreading layer).
Figure 14:
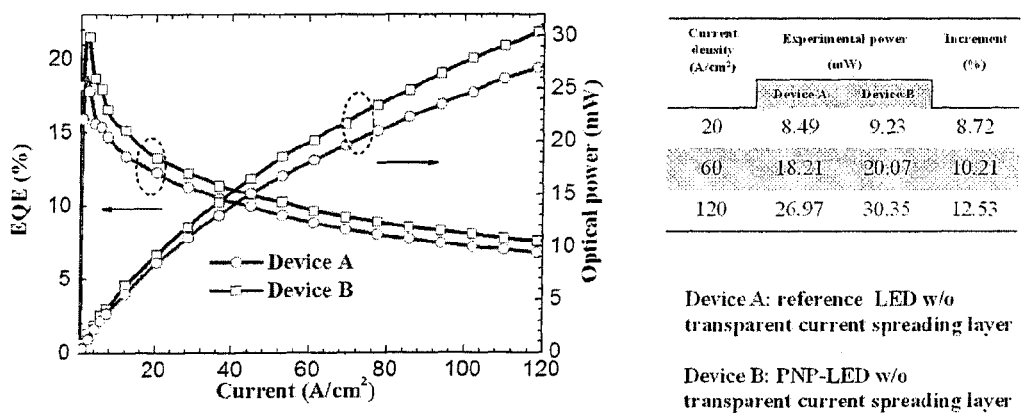
FIG. 14 is a graph of the experimentally measured optical output power and external quantum efficiency for Devices A and B (Device A: reference LED without transparent current spreading layer; Device B: PNP-LED without transparent current spreading layer).
Figure 20A:
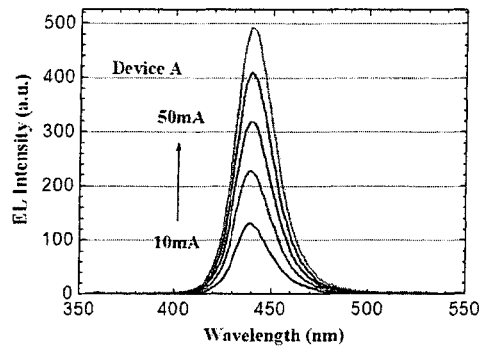
FIG. 20A is a graph of the experimentally measured emission spectra for Device A (Device A: reference LED with transparent current spreading layer).
Figure 20B:
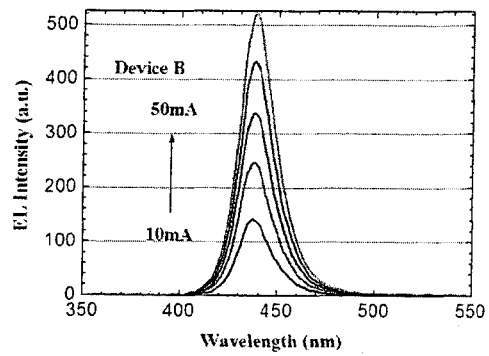
FIG. 20B is a graph of the experimentally measured emission spectra for Device B (Device B: PNP-LED with transparent current spreading layer).
Figure 21:
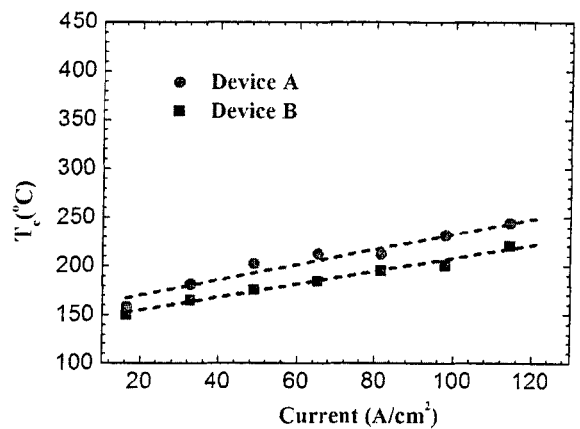
FIG. 21 is a graph of the carrier temperature for Devices A and B (Device A: reference LED with transparent current spreading layer; Device B: PNP-LED with transparent current spreading layer).
Figure 22:
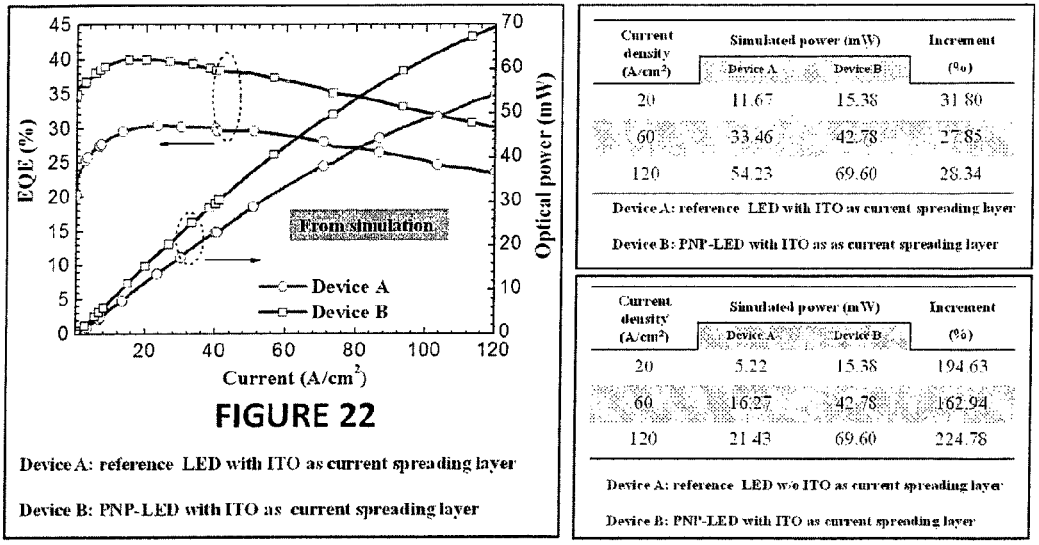
FIG. 22 is a graph of the simulated optical output power and external quantum efficiency for Devices A and B (Device A: reference LED with transparent current spreading layer; Device B: PNP-LED with transparent current spreading layer).
Figure 23:
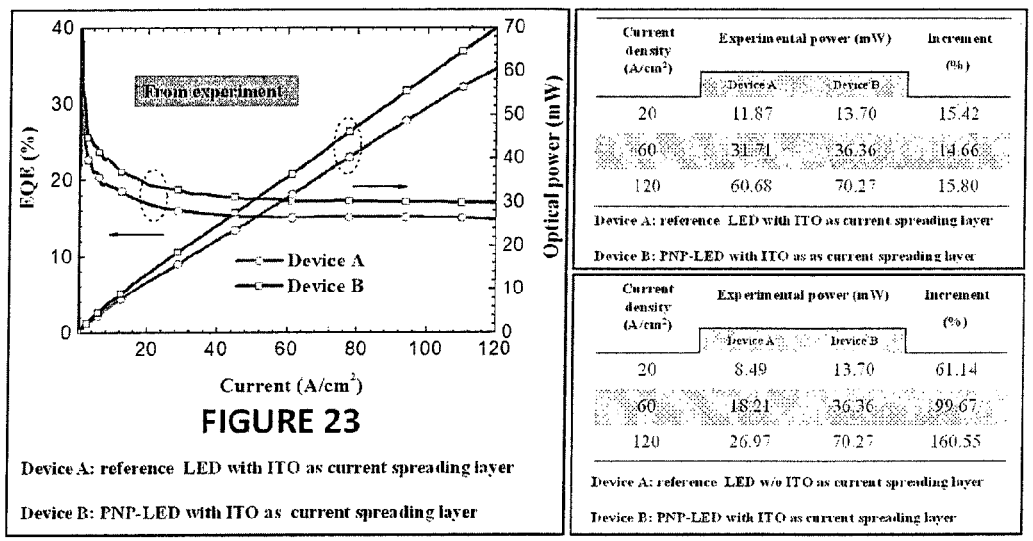
FIG. 23 is a graph of the experimentally measured optical output power and external quantum efficiency for Devices A and B (Device A: reference LED with transparent current spreading layer; Device B: PNP-LED with transparent current spreading layer).

The electroluminescence (EL) spectra [FIGS. 11(a), 11(b), 20(a) and 20(b)] were collected under 10, 20, 30, 40 and 50 mA of the injection current for both Reference LEDs without and with ITO and PNPNP-GaN LEDs without and with ITO. Both the EL spectra of Reference LED without ITO and PNPNP-LED without ITO in FIGS. 11(a) and 11(b) show a red shift as the injection current level increases, which is due to a gradually increasing junction temperature during testing. However, a less pronounced red shift observed in the EL spectra of Reference LED with ITO and PNPNP-LED with ITO in FIGS. 20(a) and 20(b) is attributed to the significantly improved current spreading after ITO incorporation, which suppresses the high local heat caused by current crowding. We can also see the EL intensity of PNPNP-GaN LEDs without and with ITO is enhanced compared to that of Reference LEDs without and with ITO, respectively. We also measured the integrated optical output power and EQE (FIGS. 14 and 23), which is compared with the simulated results for the four sets of studied devices (FIGS. 13 and 22). We can see an improved optical output power and EQE for PNPNP-GaN LEDs without and with ITO in both experiments and simulations. Compared to Reference LED without ITO in FIG. 14, PNPNP-GaN LED without ITO shows a power enhancement of 10.19% and 12.16% at 20 mA and 100 mA, respectively, while PNPNP-GaN LED with ITO in FIG. 23 enhances the output power by 16.98% and 14.37% at 20 mA and 100 mA, respectively compared to Reference LED with ITO. The improved device performance in PNPNP-GaN LEDs without and with ITO is attributed to the reduced current crowding effect. This in turn suppresses the high local carrier concentration, resulting in the reduced non-radiative Auger recombination in the multiple quantum wells.

Figure 15A:
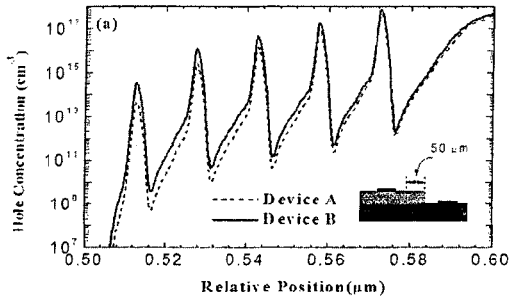
FIG. 15A is a graph of the calculated hole distribution for Devices A and B (Device A: reference LED without transparent current spreading layer; Device B: PNP-LED without transparent current spreading layer).
Figure 15B:
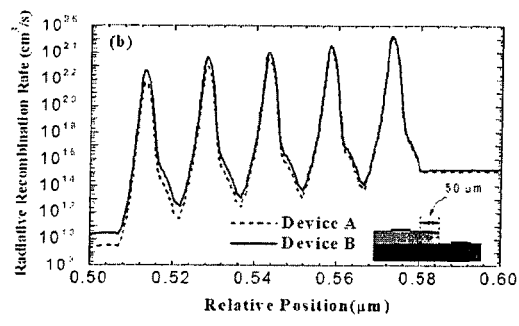
FIG. 15B is a graph of the calculated radiative recombination rates for Device A and B (Device A: reference LED without transparent current spreading layer; Device B: PNP-LED without transparent current spreading layer).
Figure 24A:
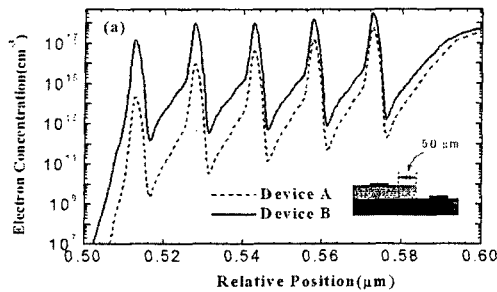
FIG. 24A is a graph of the calculated hole distribution for Devices A and B (Device A: reference LED with transparent current spreading layer; Device B: PNP-LED with transparent current spreading layer).
Figure 24B:
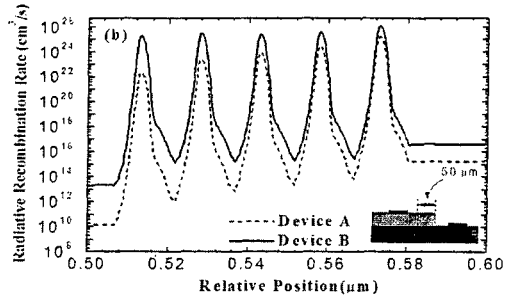
FIG. 24B is a graph of the calculated radiative recombination rates for Device A and B (Device A: reference LED with transparent current spreading layer; Device B: PNP-LED with transparent current spreading layer).

As is shown in FIGS. 15A and 15B, the higher hole concentration and radiative recombination rates collected at 50 μm from the mesa edge are obtained in the PNP-GaN LED, and this applies to the LED that employing PNP-GaN current spreading layer with transparent current spreading layer as well, which are shown in FIGS. 24A and 24B.

Figure 6:
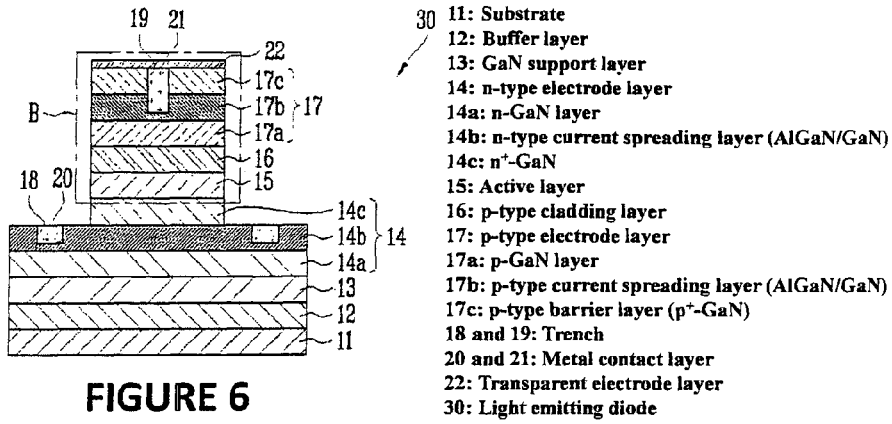
Figure 7A:
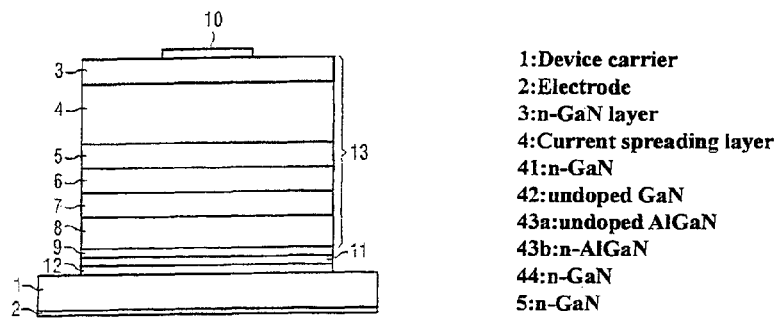
Figure 7B:
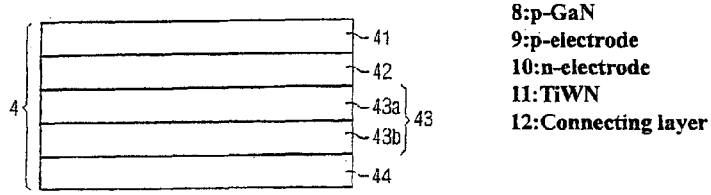

The first and second embodiments may maintain excellent crystal quality compared to the work demonstrated in FIG. 1, which employed heavily doped layers, and the crystal is very likely to be damaged by generating dislocations. Meanwhile, the PNP current spreading layer may be directly achieved in the metal-organic chemical vapor deposition (MOCVD), saving additional post-growth treatment as shown in FIG. 2, FIG. 5A and FIG. 5B. Besides, the energy barrier height can be more significant for better current spreading effect if we combine PNP semiconductor materials together rather than that using undoped region as illustrated in FIG. 3. As has been mentioned, the PNP region may consume no voltage, which is different from FIG. 4, which needs higher bias to generate strong electric field for the interband tunneling. Finally, the N-type semiconductor material and P-type semiconductor material (e.g. N-GaN and P-GaN) may share similar growth process and there may be no lattice mismatch between the two layers, and therefore, even more PNP periods can be surely grown for even better current spreading effect while the excellent crystal quality can still be easily maintained, and additionally the growth budget may be saved compared to the technologies in FIG. 6 and FIG. 7.

Commercial Application:

In summary, embodiments are not limited to InGaN/GaN LEDs but all kinds of semiconductor LEDs. One or more embodiments may achieve enhanced optical output power and external quantum efficiency (EQE), while reducing the electricity power consumption. In other words, improved luminous efficacy (unit in lumens per watt) and a reduced cost per light (unit in $/lumens) may be achieved. On top of the improved optical output power and thus luminous efficacy, one or more embodiment may also reduce the localized heating due to the current crowding, which in turns facilitate high-power LEDs operation and also reduces the failure rate due to the LEDs localized heating during operation. Embodiments may be applied to the optoelectronics industry especially for LED application, such as GaAs, GaP, and also GaN-based LEDs.

Whilst exemplary embodiments of the invention have been described in detail, many variations are possible within the scope of the invention as will be clear to a skilled reader.

The invention claimed is:

1. A light emitting device comprising:
an electron injecting layer;
a hole injecting layer; and
an active layer sandwiched between the electron injecting layer and the hole injecting layer, wherein:
the hole injecting layer comprises a plurality of current spreading layers, the plurality of current spreading layers including a first P doped layer, a first N doped layer and a second P doped layer, and
the first N doped layer has a doping level and thickness configured for substantial depletion or full depletion.

2. The device in claim 1 wherein a thickness of a depletion region in the current spreading layers is between 0 nm to 300 nm under equilibrium.

3. The device in claim 2 wherein the thickness of the depletion region is between 0 nm-178.37 nm under equilibrium.

4. The device in claim 2 wherein a thickness of the first N doped layer is smaller than the depletion region thickness under equilibrium or non-equilibrium.

5. The device in claim 1 wherein a built-in voltage of the first N doped layer is greater than a reach-through breakdown voltage.

6. The device in claim 1 wherein:
minority carriers in one of the current spreading layers have a diffusion length determined according to:

$$L_D = \sqrt{D_p \tau_p} = \sqrt{kT\mu_p/e\tau_p};$$

the minority carriers comprise holes;
$D_p$ is a diffusion constant of holes, correlated with $\mu_p$ by Einstein relationship; and
k is a Boltzman constant.

7. The device in claim 1 wherein a barrier height in a PNP junction in the current spreading layers is greater than 0.005 eV.

8. The device in claim 1 wherein an ideality factor for diodes of the device ranges from 1 to 7.

9. The device in claim 1 wherein dopants in the first N doped layer are configured to become ionized and act as hole spreaders when the first N doped layer is substantially depleted or fully depleted.

10. The device in claim 1 wherein the plurality of current spreading layers are lattice matched to the active layer and/or the electron injecting layer.

11. The device in claim 1 wherein each of the plurality of current spreading layers comprising a semiconductor material selected from the group consisting of GaN, InGaN, AlInGaN AlInGaPAsSb, ZnO, CdSe, and any combination thereof.

12. The device in claim 1 wherein the P doped layers are doped with a material selected from the group consisting of Be, Mg, Zn, P, N, As, Sb, and any combination thereof.

13. The device in claim 1 wherein the first N doped layer are doped with a material selected from the group consisting of Si, Ge, O, Ga, Al, and any combination thereof.

14. The device in claim 1 wherein a Mg doping level of the P doped layers is above an intrinsic carrier concentration and a Si doping of the first N doped layer is above an intrinsic carrier concentration.

15. The device in claim 1 further comprising a transparent current spreading layer on the plurality of current spreading layers, the transparent current spreading layer selected from the group consisting of Indium Tin Oxide (ITO), Gallium doped zinc oxide (GZO), Aluminium doped zinc oxide (AZO), Fluorine Tin Oxide (FTO), Graphene and any combination thereof.

16. The device in claim 1 further comprising a semi-transparent current spreading layer on the plurality of current spreading layers, the semi-transparent current spreading layer comprising alloyed Ni/Au.

17. The device in claim 1 wherein the plurality of current spreading layers further comprising a second N doped layer and a third P doped layer.

18. The device in claim 1 wherein the first N doped layer is configured to be fully depleted, a diffusion length of minority carriers in one of the current spreading layers is shorter than an n-type layer thickness, the minority carriers comprising holes; and a reach-through breakdown voltage for the n-type layer is configured to be provided by an external applied bias.

19. A method of fabricating a light emitting device comprising:
epitaxially depositing a first P type current spreading layer on or adjacent to an active layer,
epitaxially depositing a first N type current spreading layer on or adjacent to the first P type current spreading layer, epitaxially depositing a second P type current spreading layer on or adjacent to the first N type current spreading layer, and activating dopants in the first and second P type current spreading layers.

20. A light emitting diode comprising a PNP semiconductor material current spreading layer, wherein an N-type semiconductor is configured to be completely or substantially depleted, leaving ionized Si atoms acting as current spreaders, wherein the PNP semiconductor material current spreading layer consumes no minority carriers, as a thickness of the N-type semiconductor is smaller than a diffusion length of minority carriers, and wherein a depletion voltage in the PNP semiconductor material current spreading layer exceeds a reach-through breakdown voltage minimising a voltage loss in the PNP semiconductor material current spreading layer.

* * * * *